(12) United States Patent
Hsieh et al.

(10) Patent No.: US 12,306,263 B2
(45) Date of Patent: *May 20, 2025

(54) POWER AMPLIFIERS TESTING SYSTEM AND RELATED TESTING METHOD

(71) Applicant: TAIWAN SEMICONDUCTOR MANUFACTURING COMPANY LTD., Hsinchu (TW)

(72) Inventors: Hsieh-Hung Hsieh, Taipei (TW); Wu-Chen Lin, Hsinchu (TW); Yen-Jen Chen, Taipei (TW); Tzu-Jin Yeh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/409,828

(22) Filed: Jan. 11, 2024

(65) Prior Publication Data

US 2024/0142544 A1    May 2, 2024

Related U.S. Application Data

(63) Continuation of application No. 17/818,141, filed on Aug. 8, 2022, now Pat. No. 11,906,598, which is a
(Continued)

(51) Int. Cl.
*G01R 31/40* (2020.01)
*G01R 29/08* (2006.01)
(Continued)

(52) U.S. Cl.
CPC ......... *G01R 31/40* (2013.01); *G01R 29/0871* (2013.01); *H03F 3/211* (2013.01);
(Continued)

(58) Field of Classification Search
USPC .......................................................... 324/629
See application file for complete search history.

(56) References Cited

U.S. PATENT DOCUMENTS

2010/0182036 A1* 7/2010 Regan ................ H01L 21/6831
324/123 R
2011/0234204 A1    9/2011 Tamura
(Continued)

FOREIGN PATENT DOCUMENTS

CN    103620955 A    3/2014
CN    107345987 A    11/2017
(Continued)

OTHER PUBLICATIONS

US 2018226367 A1 is the US counterpart of TW 201838322 A.
(Continued)

*Primary Examiner* — Farhana A Hoque
(74) *Attorney, Agent, or Firm* — WPAT LAW; Anthony King

(57) ABSTRACT

A testing system includes: a dividing circuit configured to receive a testing signal and provide a plurality of input signals according to the testing signal; and a plurality of integrated power-amplifiers coupled to the dividing circuit, each of the plurality of integrated power-amplifiers being configured to be tested by receiving a respective input signal of the plurality of input signals and generating a respective output signal for a predetermined testing time.

20 Claims, 8 Drawing Sheets

Related U.S. Application Data continuation of application No. 16/668,986, filed on Oct. 30, 2019, now Pat. No. 11,493,563.

(51) Int. Cl.
  *H03F 3/21* (2006.01)
  *H03F 3/24* (2006.01)
(52) U.S. Cl.
  CPC ....... *H03F 3/245* (2013.01); *H03F 2200/267* (2013.01); *H03F 2200/451* (2013.01)

(56) References Cited

U.S. PATENT DOCUMENTS

2013/0307525 A1  11/2013  Chen
2015/0024693 A1*  1/2015  Cook .................... H04B 17/19
                                                              455/67.14
2019/0097580 A1  3/2019  Laighton et al.

FOREIGN PATENT DOCUMENTS

CN  108120891 A   6/2018
KR  101882134 B1  8/2018
TW  201212552 A   3/2012
TW  201838322 A   10/2018

OTHER PUBLICATIONS

US 2011299438 A1 is the US counterpart of TW 201212552 A.
Jie Zhang, "Test of High Efficiency RF Power Amplifier Based on SMW200A", China Intergrated Circuit, vol. 217, 2017, p. 65-67.
English Abstract Translation of CN103620955A.
English Abstract Translation of KR101882134B1.
English Abstract of CN108120891A.
English Abstract of CN107345987A.

* cited by examiner

POWER AMPLIFIERS TESTING SYSTEM AND RELATED TESTING METHOD

PRIORITY CLAIM AND CROSS-REFERENCE

This application is a continuation application of U.S. patent application Ser. No. 17/818,141, filed on Aug. 8, 2022, which is a continuation of application of U.S. patent application Ser. No. 16/668,986, filed on Oct. 30, 2019, which applications are hereby incorporated herein by reference.

BACKGROUND

A power amplifier is arranged to convert a low-power signal into a larger signal of significant power. The power amplifier may be used for driving the antenna of a transmitter. High efficiency and high output power are two main features of the power amplifier. To validate the reliability of the power amplifier, a testing process may be performed upon the power amplifier when the power amplifier is manufactured. Therefore, providing a high throughput and accurate reliability testing method is highly desirable in this field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
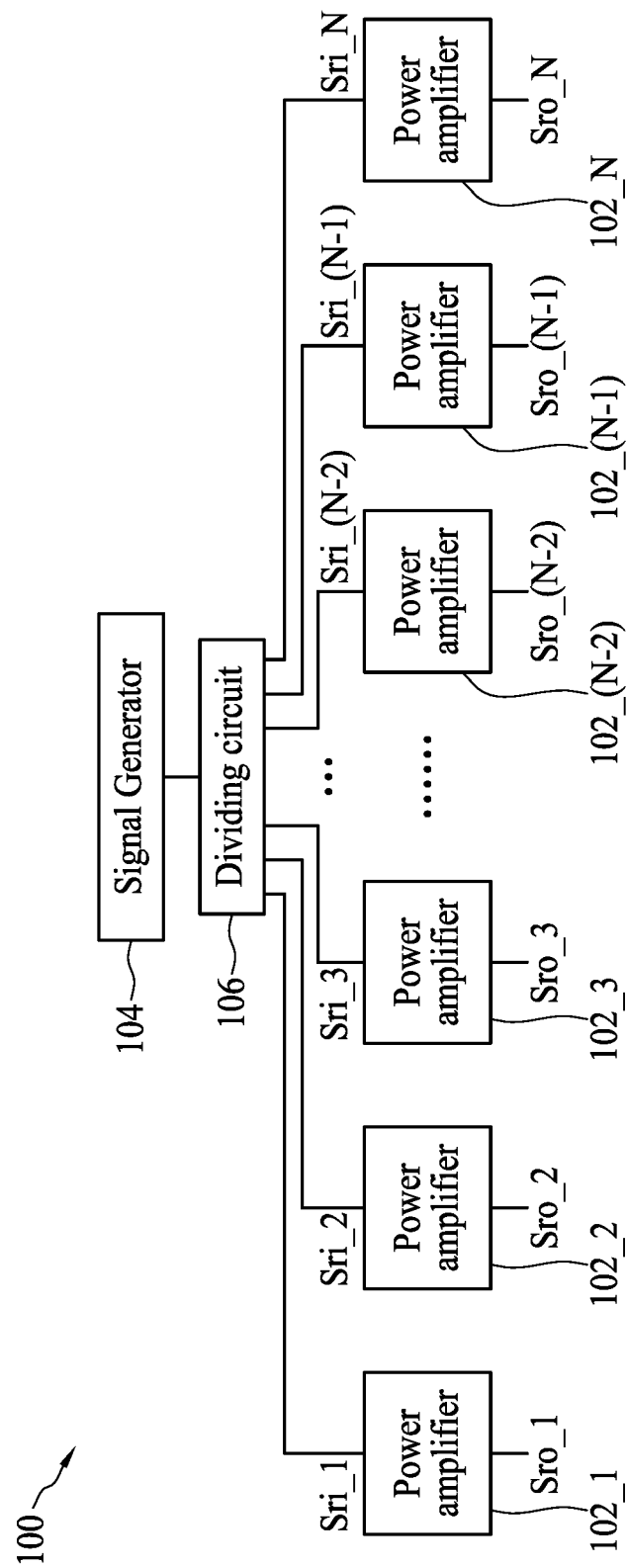
FIG. 1 is a diagram illustrating a testing system accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a testing system 100 accordance with some embodiments. The testing system 100 is a multi-chip testing system. The testing system 100 comprises a plurality of power amplifiers 102_1-102_N, a signal generator 104 and a dividing circuit 106. The testing system 100 is configured to test the radio frequency (RF) reliability of the power amplifiers 102_1-102_N. According to some embodiments, the plurality of power amplifiers 102_1-102_N are arranged to be a plurality of power-amplifiers chips respectively. The plurality of power amplifiers 102_1-102_N are implemented in multiple chips respectively, and the multiple chips may be on-wafer or discrete chips. The multiple chips may be tested simultaneously. Moreover, the power amplifiers 102_1-102_N may be RF power amplifiers, and the testing system 100 is arranged to simultaneously perform RF stress upon the power amplifiers 102_1-102_N. The testing system 100 may improve the efficiency or throughput of the RF reliability test of the power amplifiers 102_1-102_N. To perform the RF reliability test, the output powers of the power amplifiers 102_1-102_N may be relatively large to validate the device reliability limitation. In some embodiments, several design techniques are introduced for the power amplifiers 102_1-102_N to generate the large powers. According to some embodiments, the RF reliability test of the power amplifiers 102_1-102_N may be performed under relatively high temperature. For example, the RF reliability test of the power amplifiers 102_1-102_N may be performed in an oven such that the power amplifiers 102_1-102_N may be uniformly heated.

Moreover, to realize how the device (e.g. transistor) in the power amplifier is impacted by the RF stress, in some embodiments, a device-level characterizing process is introduced to characterize the device-level (e.g. transistor level) characteristics in each of the power amplifiers 102_1-102_N after the RF stress.

To perform the multi-chip reliability test, the signal generator 104 in combination with the dividing circuit 106 are arranged to provide RF input power to each of the power amplifiers 102_1-102_N during the reliability test. According to some embodiments, the signal generator 104 is arranged to generate a testing signal St. The testing signal St may be a sinusoidal signal (or a modulated signal) with a predetermined frequency. According to some embodiments, the signal generator 104 may be an oscillator, a phase-lock loop (PLL) circuit, or a frequency synthesizer. The signal generator 104 may be an on-chip circuit integrated with the power amplifiers 102_1-102_N, or an off-chip circuit externally coupled to the power amplifiers 102_1-102_N.

The dividing circuit 106 is coupled to the signal generator 104 and the power amplifiers 102_1-102_N, for providing a plurality of RF input signal Sri_1-Sri_N to the power amplifiers 102_1-102_N according to the testing signal St respectively. According to some embodiments, the power divider 106 may be a power divider arranged to divide the power of the testing signal St by N to generate the RF input signal Sri_1-Sri_N. When the dividing circuit 106 is arranged to divide the power of the testing signal St by N, the powers (or swings) of the RF input signal Sri_1-Sri_N are the same. However, this is not a limitation of the present embodiments. In another embodiment, the dividing circuit 106 may generate the RF input signal Sri_1-Sri_N with different powers for the power amplifiers 102_1-102_N respectively. Moreover, the dividing circuit 106 may be implemented by passive module, which may be externally coupled to the power amplifiers 102_1-102_N, or on-chip power divider, which is integrated with the power amplifiers 102_1-102_N.

According to some embodiments, the power amplifiers 102_1-102_N may be a plurality of on-wafer power amplifiers. The power amplifiers 102_1-102_N may be a plurality of individual power amplifiers in package style, in which the packaged power amplifiers are connected to the dividing circuit 106 through the way of wire-bonds, flip-chip, or integrated Fan-Out (InFO). The power amplifiers 102_1-102_N may be a plurality of integrated power amplifiers. The power amplifiers 102_1-102_N may be integrated with the signal generator 104 and/or the dividing circuit 106.

According to some embodiments, during the RF reliability test, the RF input signal Sri_1-Sri_N may be inputted to the power amplifiers 102_1-102_N at the same time. The power amplifiers 102_1-102_N may continuously generate a plurality of RF output signals Sro_1-Sro_N with high output powers (e.g. about 20 dBm) for a long time (e.g. a week) under a predetermined environment temperature (e.g. 85° C.) according to the RF input signal Sri_1-Sri_N respectively. During the testing time, the devices (e.g. the transistors) in the power amplifiers 102_1-102_N may undergo RF stress caused by the RF signals transmitted through the power amplifiers 102_1-102_N. It is noted that the signal powers of the RF input signal Sri_1-Sri_N (as well as the powers of the corresponding RF output signals Sro_1-Sro_N) may be similar with each other, different from each other, partially similar with each other, or partially different from each other.

Moreover, to evaluate the impact of the power amplifiers 102_1-102_N after the RF stress process, the functions (e.g. output power and/or power added efficiency) of the power amplifiers 102_1-102_N and the current characteristic (e.g. the saturation currents of the transistors) of the power amplifiers 102_1-102_N may be measured before and after the RF stress process. By comparing the measured results of the power amplifiers 102_1-102_N before and after the RF stress process, the reliability of the power amplifiers 102_1-102_N may be obtained.

Figure 2:
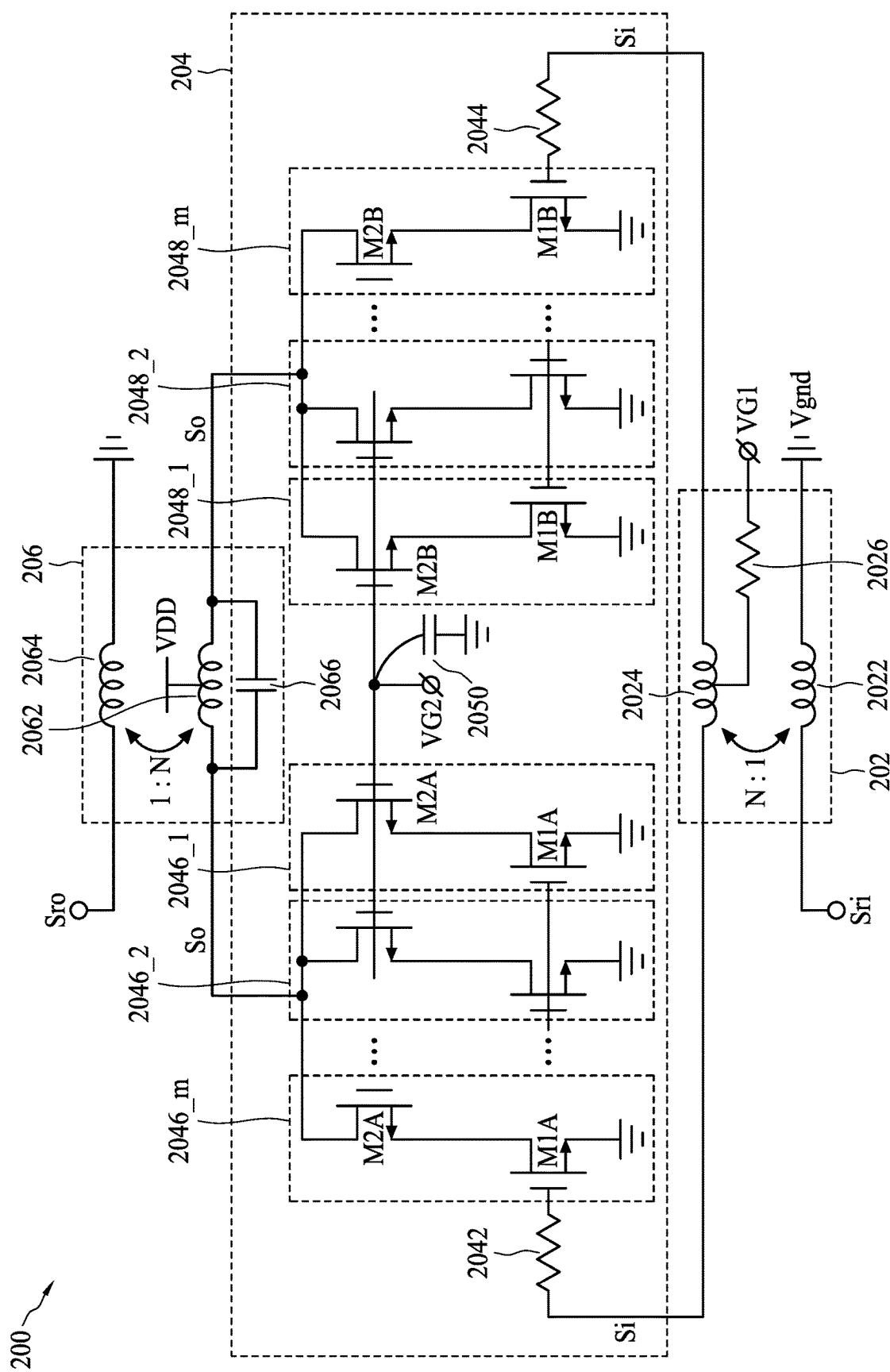
FIG. 2 is a diagram illustrating a power amplifier in accordance with some embodiments.

FIG. 2 is a diagram illustrating a power amplifier 200 in accordance with some embodiments. Each of the power amplifiers 102_1-102_N may have the same configuration with the power amplifier 200. According to some embodiments, the power amplifier 200 is capable of generating sufficiently high output power (e.g. 20 dBm) during the RF reliability test. The power amplifier 200 comprises a first transforming circuit 202, a gain stage 204, and a second transforming circuit 206.

The first transforming circuit 202 is arranged to receive an RF input signal Sri for generating a differential input signal Si. According to some embodiments, the first transforming circuit 202 comprises a first inductor 2022, a second inductor 2024, and a resistor 2026. The first inductor 2022 and the second inductor 2024 may be the primary winding and the secondary winding respectively. The first inductor 2022 has a first terminal coupled to the input signal Sri, and a second terminal coupled to a reference voltage level, e.g. the ground voltage Vgnd. The second inductor 2024 is magnetically coupled to the first inductor 2022. The second inductor 2024 has a first terminal and a second terminal for outputting the differential input signal Si. The resistor 2026 has a first terminal coupled to a predetermined position (e.g. a center) of the second inductor 2024, and a second terminal coupled to a first reference voltage VG1. The first reference voltage VG1 may be the common voltage of the differential input signal Si.

The gain stage 204 is coupled to the first transforming circuit 202 for generating a differential output signal So according to the differential input signal Si. According to some embodiments, the gain stage 204 comprises a first resistor 2042, a second resistor 2044, a plurality of first circuit stages 2046_1-2046_m, a plurality of second circuit stages 2048_1-2048_m, and a capacitor 2050. The first circuit stages 2046_1-2046_m and the second circuit stages 2048_1-2048_m are configured to be the differential circuit stages (i.e. differential pairs). Each of the first circuit stages 2046_1-2046_m comprises a first field-effect transistor (FET) M1A and a second FET M2A. The FETs M1A and M2A are configured to be a cascoded gain stage, in which the FET M1A is a common-source transistor, and the FET M2A is a common-gate transistor. Each of the second circuit stages 2048_1-2048_m comprises a first FET M1B and a second FET M2B. The FETs M1B and M2B are configured to be a cascoded gain stage, in which the FET M1B is a common-source transistor, and the FET M2B is a common-gate transistor. It is noted that each of the FETs comprises two connecting terminals (e.g. drain and source) and a control terminal (e.g. gate). Moreover, to increase the output power of the power amplifier 200 and to reduce the parasitic capacitances of the circuit stages 2046_1-2046_m and 2048_1-2048_m, the circuit stages 2046_1-2046_m are connected in parallel, and the circuit stages 2048_1-2048_m are connected in parallel. Therefore, the circuit stages 2046_1-2046_m and 2048_1-2048_m are arranged to be a plurality of slicing cascoded stages respectively. More specifically, the drains of the FETs M1A (or the sources of the FETs M2A) in the circuit stages 2046_1-2046_m are physically separated from each other. The drains of the FETs M1B (or the sources of the FETs M2B) in the circuit stages 2048_1-2048_m are physically separated from each other.

According to some embodiments, the first resistor 2042 has a first terminal coupled to the first terminal of the second inductor 2024, and a second terminal coupled to the gates of the first FETs M1A of the first circuit stages 2046_1-2046_m. The sources of the first FETs M1A of the first circuit stages 2046_1-2046_m are coupled to the ground voltage Vgnd. The drains of the first FETs M1A of the first circuit stages 2046_1-2046_m are coupled to the sources of the second FETs M2A of the first circuit stages 2046_1-2046_m respectively. The gates of the second FETs M2A of the first circuit stages 2046_1-2046_m are coupled to a second reference voltage VG2. The drains of the second FETs M2A of the first circuit stages 2046_1-2046_m are coupled to a first input terminal of the second transforming circuit 206.

The second resistor 2044 has a first terminal coupled to the second terminal of the second inductor 2024, and a second terminal coupled to the gates of the first FETs M1B of the second circuit stages 2048_1-2048_m. The sources of the first FETs M1B of the second circuit stages 2048_1-2048_m are coupled to the ground voltage Vgnd. The drains of the first FETs M1B of the second circuit stages 2048_1-2048_m are coupled to the sources of the second FETs M2B of the second circuit stages 2048_1-2048_m respectively. The gates of the second FETs M2B of the second circuit stages 2048_1-2048_m are coupled to the second reference voltage VG2. The drains of the second FETs M2B of the second circuit stages 2048_1-2048_m are coupled to a second input terminal of the second transforming circuit 206.

Moreover, the capacitor 2050 has a first terminal coupled to the second reference voltage VG2 and a second terminal coupled to the ground voltage Vgnd.

According to some embodiments, the second reference voltage VG2 may be regarded as the differential virtual ground of the FETs M2A of the first circuit stages 2046_1-2046_m and the FETs M2B of the second circuit stages 2048_1-2048. Accordingly, the gates of the FETs M2A of the first circuit stages 2046_1-2046_m and the FETs M2B of the second circuit stages 2048_1-2048 may have better AC (Alternating Current) grounding performance, and the output power of the power amplifier 200 may be increased.

The second transforming circuit 206 is coupled to the gain stage 204 for receiving the differential output signal So to generate an RF output signal Sro. According to some embodiments, the second transforming circuit 206 comprises a first inductor 2062, a second inductor 2064, and a capacitor 2066. The first inductor 2062 and the second inductor 2064 may be the primary winding and the secondary winding respectively. The first terminal and the second terminal of the first inductor 2062 are arranged to receive the differential output signal So. More specifically, the first terminal of the first inductor 2062 is coupled to the drains of the second FETs M2A of the first circuit stages 2046_1-2046_m. The second terminal of the first inductor 2062 is coupled to the drains of the second FETs M2B of the second circuit stages 2048_1-2048_m. A predetermined position (e.g. a center) of the first inductor 2062 is coupled to a reference voltage, e.g. the supply voltage VDD. The supply voltage VDD may be the common voltage of the differential output signal So. In addition, the second inductor 2064 has a first terminal arranged to output the RF output signal Sro, and a second terminal coupled to the ground voltage Vgnd.

According to some embodiments, the first inductor 2062 and the capacitor 2066 are configured to be an LC (Inductor-Capacitor) resonator. The LC resonator may further increase the output power of the power amplifier 200. Moreover, the first resistor 2042 and the second resistor 2044 may stabilize the power amplifier 200 when the power amplifier 200 outputs the high output power during the RF reliability test. In other words, the oscillation of the power amplifier 200 may be avoided by using the first resistor 2042 and the second resistor 2044 during the RF reliability test.

In addition, the ratio of the turns of the first inductor 2022 to the turns of the second inductor 2024 is N1:1, and the ratio of the turns of the first inductor 2062 to the turns of the second inductor 2064 is 1:N2, wherein N1 and N2 are greater than 1. The number N1 may be equal to the number N2. However, this is not a limitation of the present embodiments. The number N1 may be different from the number N2.

Figure 3:
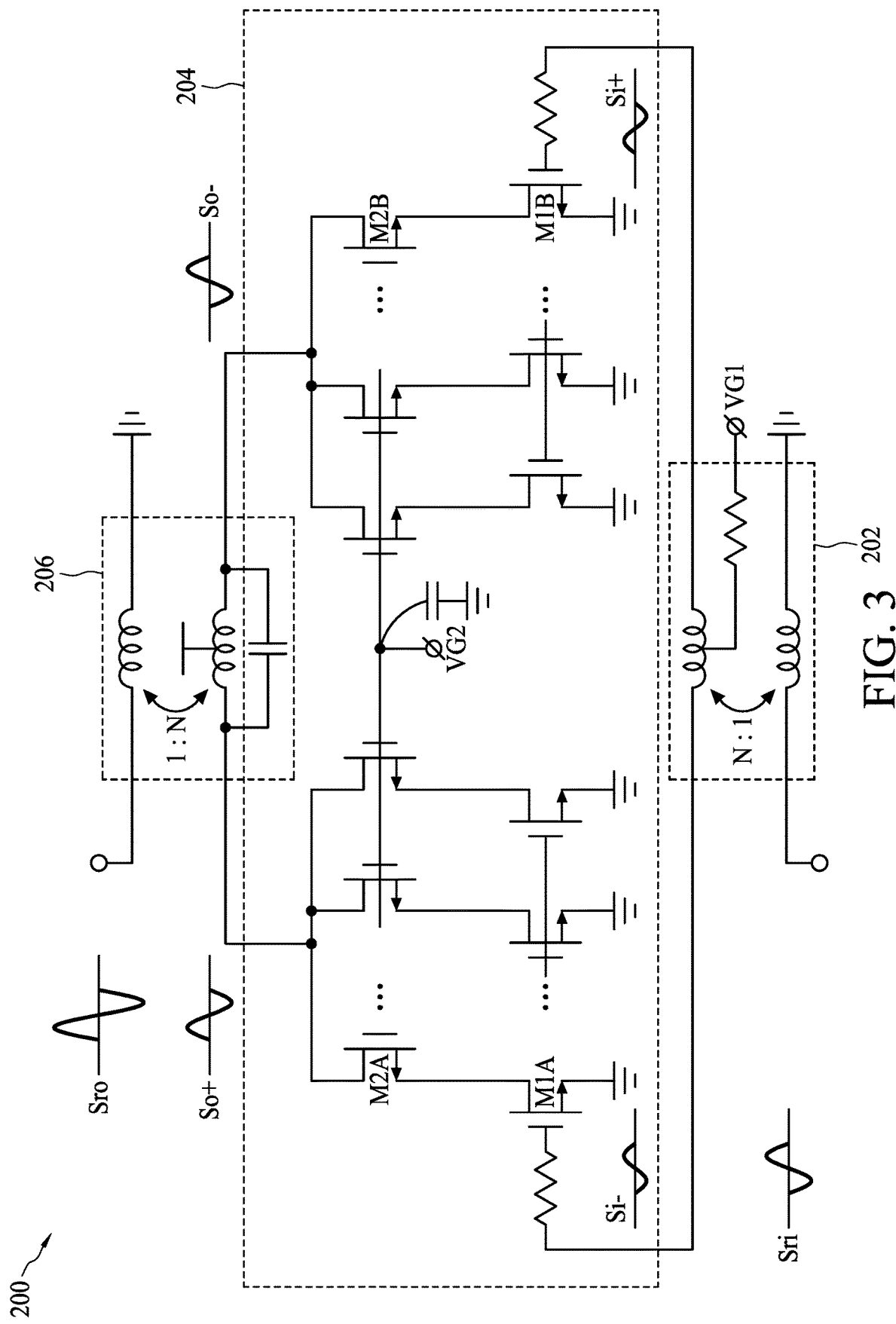
FIG. 3 is a diagram illustrating a power amplifier with signal waveforms in accordance with some embodiments.

When the ratio of the turns of the first inductor 2022 to the turns of the second inductor 2024 is N1:1 and the ratio of the turns of the first inductor 2062 to the turns of the second inductor 2064 is 1:N2, the voltage swings of the signals in the gain stage 204 may be reduced such that the reliability issue during the testing process may be alleviated. FIG. 3 is a diagram illustrating the input signal Sri, the differential input signal Si (i.e. Si+ and Si−), the differential output signal So (i.e. So+ and So−), the RF output signal Sro in the power amplifier 200 in accordance with some embodiments. When the input signal Sri is inputted to the power amplifier 200 through the first transforming circuit 202, the voltage swing of the input signal Sri may be reduced by the first transforming circuit 202 due to the turns ratio (i.e. N1:1). When the voltage swing of the differential input signal Si is smaller than the voltage swing of the input signal Sri, the RF stress of the devices in the gain stage 204 during the testing process may be reduced, and the reliability issue of the devices (e.g. the FETs M1A, M1B, M2A, M2B) in the gain stage 204 may be alleviated during the testing process.

When the differential output signal So is outputted to the second transforming circuit 206, the voltage swing of the differential output signal So may be enlarged by the second transforming circuit 206 due to the turns ratio (i.e. 1:N2). When the voltage swing of the RF output signal Sro is larger than the voltage swing of the differential output signal So, the output power of the power amplifier 200 may be increased during the testing process. In other words, the testing process of the power amplifier 200 are performed under relatively large output power while the devices (e.g. the FETs M1A, M1B, M2A, M2B) are still operated under reliable condition.

Figure 4:
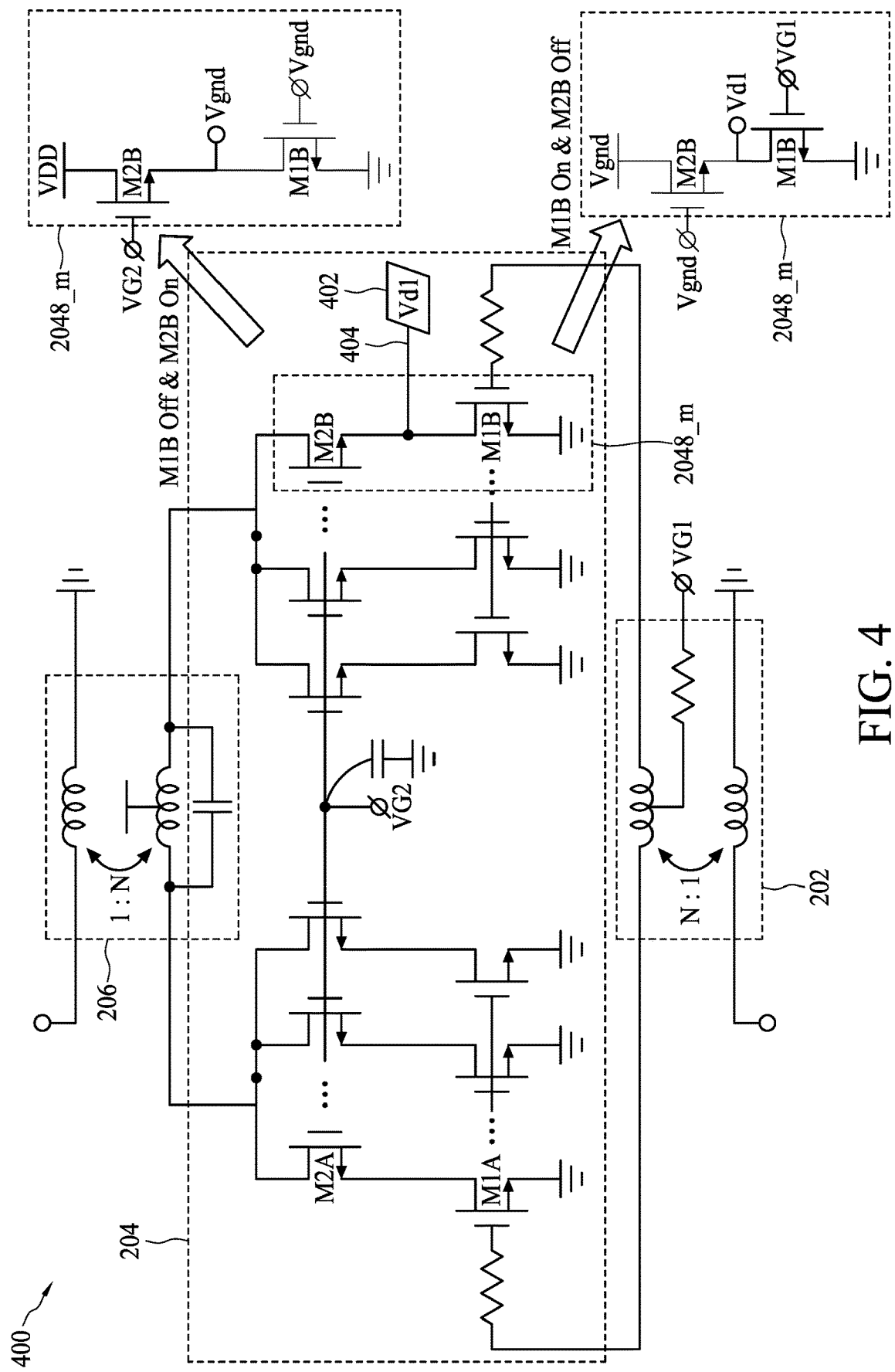
FIG. 4 is a diagram illustrating a power amplifier during a device-level characterizing process in accordance with some embodiments.

According to some embodiments, the input signal Sri may be continuously inputted to the power amplifier 200 for a relatively long testing time (e.g. a week) to test the RF reliability of the power amplifier 200. During the testing time, the devices (e.g. the FETs M1A, M1B, M2A, M2B) in the power amplifier 200 may undergo RF stress caused by the RF signals transmitted to the second transforming circuit 206 from the first transforming circuit 202. After the RF stressing process, a device-level characterizing process is performed upon the power amplifier 200 to characterize the impact caused by the RF stress. FIG. 4 is a diagram illustrating a power amplifier 400 during the device-level characterizing process in accordance with some embodiments. For brevity, the numerals in the power amplifier 400 are similar to the numerals in the power amplifier 200.

To evaluate the devices (e.g. transistors) in the power amplifier 400, the power amplifier 400 further comprises an output pad 402 and a connecting path 404. The output pad 402 is coupled to the gain stage 204 through the connecting path 404 for inputting or outputting a signal Vd1. The signal Vd1 may be the drain current or the ground voltage during the measuring process. More specifically, a first terminal of the connecting path 404 is coupled to the gain stage 204 and a second terminal of the connecting path 404 is coupled o the output pad 402. To reduce the parasitic capacitance in the circuit stages 2046_1-2046_$m$ and 2048_1-2048_$m$, the output pad 402 is connected to one of the circuit stages 2046_1-2046_$m$ and 2048_1-2048_$m$. However, this is not a limitation of the present embodiments. The power amplifier 200 may comprises a plurality of output pads connecting to a plurality of circuit stages through at least one connecting path respectively. The output pad 402 is electrically connected to the source of the FET M2B (or the drain of the FET M1B) of one of the circuit stages 2046_1-2046_$m$ and 2048_1-2048_$m$. For brevity, in this embodiment, the output pad 402 is electrically connected to the source of the FET M2B of the circuit stage 2048_$m$. The output pad 402 may be an external pad for receiving an external signal (e.g. current or voltage) from a testing device (not shown) and/or outputting a signal (e.g. current or voltage) to the testing device.

According to some embodiments, the device-level characterizing process comprises a first measuring process and a second measuring process. During the first measuring process, the FET M1B of the circuit stage 2048_$m$ is turned on and the FET M2B of the circuit stage 2048_$m$ is turned off. More specifically, during the first measuring process, the gate and the drain of the FET M2B of the circuit stage 2048_$m$ are connected to the ground voltage Vgnd (i.e. VG2=Vgnd), and the gate of the FET M1B of the circuit stage 2048_$m$ is connected to the first reference voltage VG1. During the first measuring process, the FET M1B of the circuit stage 2048_$m$ may be characterized by using the first reference voltage VG1 on the gate and the signal (e.g. the current) on the drain of the FET M1B of the circuit stage 2048_$m$ through the output pad 402.

According to some embodiments, the variation of drain current (e.g. the saturation current) of the FET M1B with respect to the first reference voltage VG1 (i.e. the gate-source voltage drop) is measured during the first measuring process. The measured current variation may be compared with the original current variation before the RF reliability test to evaluate the impact of RF stress of the FET M1B in the power amplifier 400. The original current variation of the FET M1B may be measured before the RF reliability test by using the output pad 402. Since the other FETs M1B in the other circuit stages 2048_1-2048_(m-1) and 2046_1-2046_$m$ are similar to the FET M1B in the circuit state 2048_$m$, the impact of RF stress of the other FETs M1B in the other circuit stages 2048_1-2048_(m-1) and 2046_1-2046_$m$ may similar to the impact of RF stress of the FET M1B in the circuit state 2048_$m$. Therefore, when the measured current variation of the FET M1B in the circuit stage 2048_$m$ overlaps with or is close to the original current variation of the FET M1B in the circuit stage 2048_$m$, the FETs M1B in the circuit stages 2046_1-2046_$m$ and 2048_1-2048_$m$ may pass the RF reliability test. When the measured current variation of the FET M1B in the circuit stage 2048_$m$ deviates from the original current variation of the FET M1B in the circuit stage 2048_$m$, the FETs M1B in the circuit stages 2046_1-2046_$m$ and 2048_1-2048_$m$ may fail the RF reliability test.

During the second measuring process, the FET M1B of the circuit stage 2048_$m$ is turned off and the FET M2B of the circuit stage 2048_$m$ is turned on. More specifically, during the second measuring process, the gate of the FET M1B of the circuit stage 2048_$m$ is connected to the ground voltage Vgnd (i.e. VG1=Vgnd), the source of the FET M2B of the circuit stage 2048_$m$ is connected to the ground voltage Vgnd (i.e. the output pad 402 is connected to the ground voltage Vgnd), and the gate of the FET M2B of the circuit stage 2048_$m$ is connected to the second reference voltage VG2. During the second measuring process, the FET M2B of the circuit stage 2048_$m$ may be characterized by using the second reference voltage VG2 on the gate and the signal (e.g. the current) on the source of the FET M2B of the circuit stage 2048_$m$ through the output pad 402.

According to some embodiments, the variation of drain current (e.g. the saturation current) of the FET M2B with respect to the second reference voltage VG2 (i.e. the gate-source voltage drop) is measured during the second measuring process. The measured current variation may be compared with the original current variation before the RF reliability test to evaluate the impact of RF stress of the FET M2B in the power amplifier 400. The original current variation of the FET M2B may be measured before the RF reliability test by using the output pad 402. Since the other FETs M2B in the other circuit stages 2048_1-2048_(m-1) and 2046_1-2046_$m$ are similar to the FET M2B in the circuit state 2048_$m$, the impact of RF stress of the other FETs M2B in the other circuit stages 2048_1-2048_(m-1) and 2046_1-2046_$m$ may similar to the impact of RF stress of the FET M2B in the circuit state 2048_$m$. Therefore, when the measured current variation of the FET M2B in the circuit stage 2048_$m$ overlaps with or is close to the original current variation of the FET M2B in the circuit stage 2048_$m$, the FETs M2B in the circuit stages 2046_1-2046_$m$ and 2048_1-2048_$m$ may pass the RF reliability test. When the measured current variation of the FET M2B in the circuit stage 2048_$m$ deviates from the original current variation of the FET M2B in the circuit stage 2048_$m$, the FETs M2B in the circuit stages 2046_1-2046_$m$ and 2048_1-2048_$m$ may fail the RF reliability test.

Accordingly, by performing the device-level characterizing process upon the power amplifier 400 after the RF reliability test, the reliability of the transistors in the power amplifier 400 may be evaluated and validated.

Figure 5B:
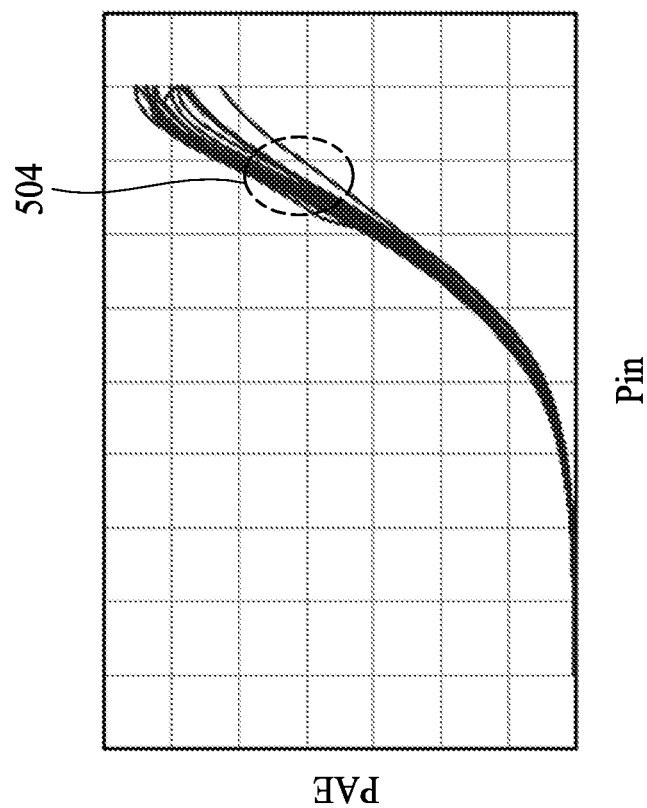
FIG. 5B is a diagram illustrating power added efficiencies with respect to input powers of power amplifiers in accordance with some embodiments.
Figure 5A:
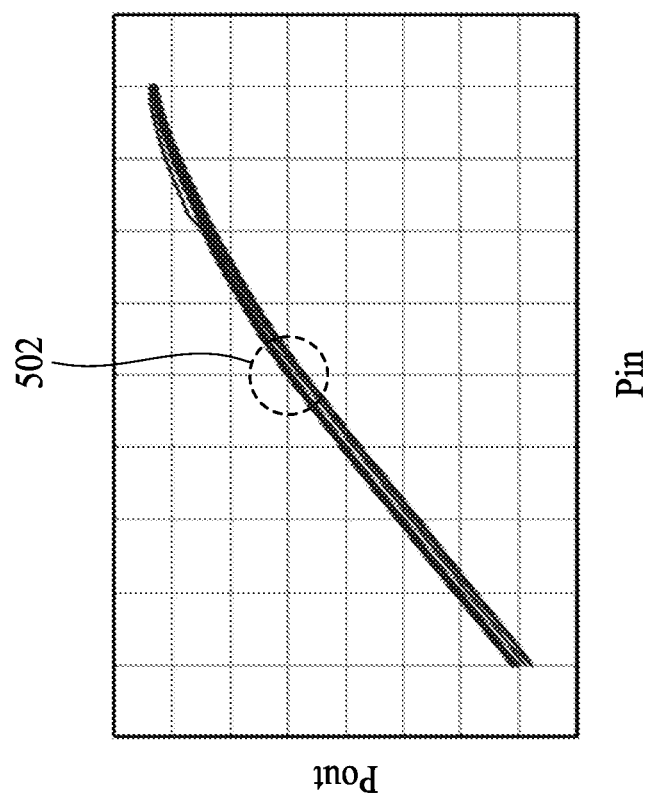
FIG. 5A is a diagram illustrating output powers with respect to input powers of power amplifiers in accordance with some embodiments.

FIG. 5A is a diagram illustrating output powers with respect to input powers of the power amplifiers 102_1-102_N in accordance with some embodiments. FIG. 5B is a diagram illustrating power added efficiencies with respect to input powers of the power amplifiers 102_1-102_N in accordance with some embodiments. For example, when the number of the power amplifiers 102_1-102_N is 14 (i.e. N=14), the testing system 100 performs the RF reliability test upon the power amplifiers 102_1-102_14 for the predetermined testing time at the same time. When the process of RF reliability test finish, the power amplifiers 102_1-102_14 are arranged to measure the output powers (i.e. Pout) with respect to input powers (i.e. Pin) respectively, and the added efficiencies (i.e. PAE) with respect to input powers (i.e. Pin) respectively. The plurality of curves (i.e. 502) in FIG. 5A represent the variations of the output powers with respect to input powers of the power amplifiers 102_1-102_14 respectively. The plurality of curves (i.e. 504) in FIG. 5B represent the variations of the power added efficiencies with respect to input powers of the power amplifiers 102_1-102_14 respectively. According to some embodiment, if the curve (output power curve or power added efficiency curve) of an power amplifier deviates from other curves of the other power amplifiers, the power amplifier with the deviated curve may fail the reliability test.

Figure 6B:
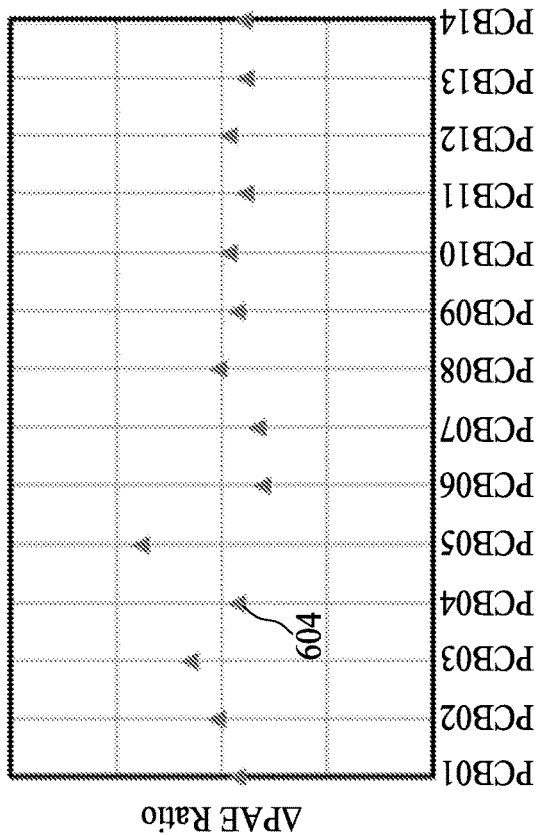
FIG. 6B is a diagram illustrating ratios of power added efficiencies before RF reliability test to power added efficiencies after the RF reliability test in accordance with some embodiments.
Figure 6A:
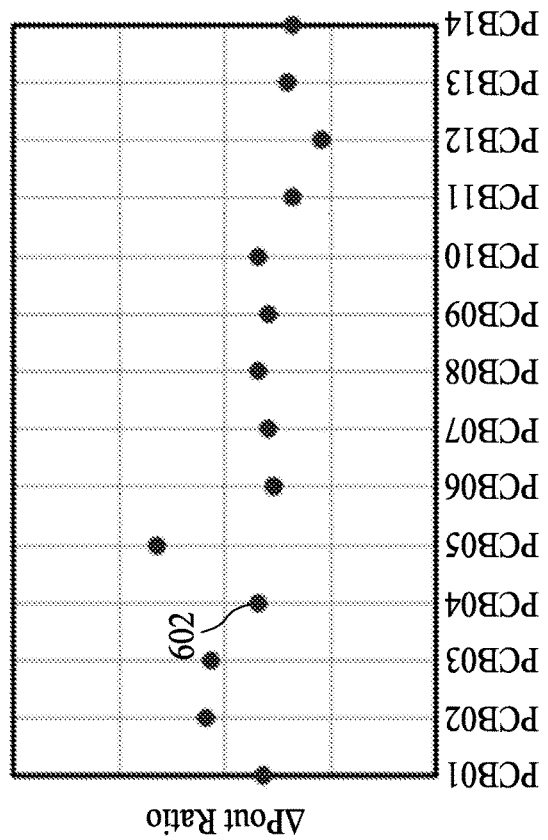
FIG. 6A is a diagram illustrating ratios of output powers before RF reliability test to output powers after the RF reliability test in accordance with some embodiments.

FIG. 6A is a diagram illustrating the ratio of the output power of each power amplifier before the RF reliability test to the output power of the power amplifier after the RF reliability test in accordance with some embodiments. FIG. 6B is a diagram illustrating the ratio of the power added efficiency of each power amplifier before the RF reliability test to the power added efficiency of the power amplifier after the RF reliability test in accordance with some embodiments. In FIG. 6A, the code names PCB01-PCB14 in x-axis represents the power amplifiers 102_1-102_14 respectively, and y-axis is the value (i.e. ΔPout Ratio) of the ratio of the output power before the RF reliability test to the output power after the RF reliability test. For example, the ΔPout Ratio of the PCB04 is 602. In FIG. 6B, y-axis is the value (i.e. ΔPAE Ratio) of the ratio of the power added efficiency before the RF reliability test to the power added efficiency after the RF reliability test. For example, the ΔPAE Ratio of the PCB04 is 606. According to some embodiment, the ratio (ΔPout Ratio or ΔPAE Ratio) of an power amplifier deviates from other ratios of the other power amplifiers, the power amplifier with the deviated ratio may fail the reliability test.

Figure 7B:
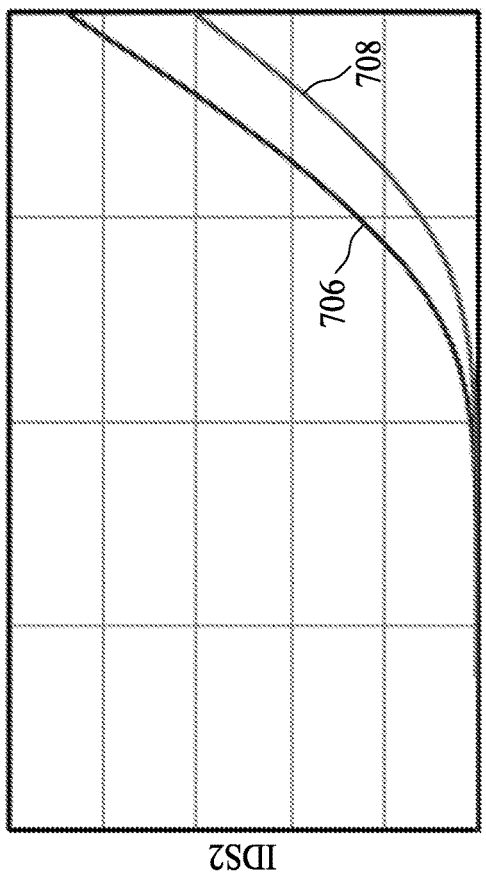
FIG. 7B is a diagram illustrating a common gate testing result of a circuit stage before and after RF reliability test in accordance with some embodiments.
Figure 7A:
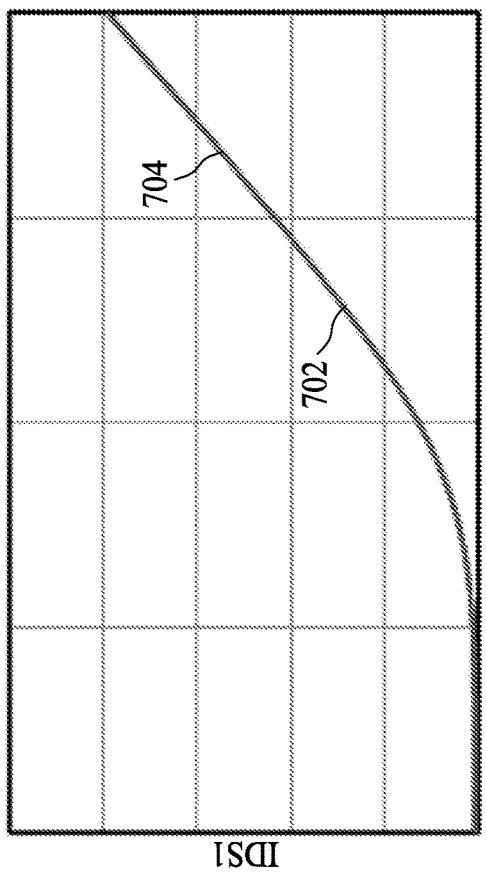
FIG. 7A is a diagram illustrating a common source testing result of a circuit stage before and after RF reliability test in accordance with some embodiments.

Please refer to FIG. 4 again. FIG. 7A is a diagram illustrating a common source testing result of a circuit stage (e.g. 2048_m) before and after the RF reliability test in accordance with some embodiments. FIG. 7B is a diagram illustrating a common gate testing result of a circuit stage (e.g. 2048_m) before and after the RF reliability test in accordance with some embodiments. According to some embodiments, the common source testing is performed upon the FET M1B, which is a common source FET, of the circuit stage 2048_m, and the common gate testing is performed upon the FET M2B, which is a common gate FET, of the circuit stage 2048_m. In FIG. 7A, x-axis represents the variation of voltage drop VGS1 from the gate of the FET M1B to the source of the FET M1B, and y-axis represents the variation of drain current IDS1 (e.g. the saturation current) of the FET M1B with respect to the voltage drop VGS1. In FIG. 7B, x-axis represents the variation of voltage drop VGS2 from the gate of the FET M2B to the source of the FET M2B, and y-axis represents the variation of drain current IDS2 (e.g. the saturation current) of the FET M2B with respect to the voltage drop VGS2. According to some embodiments, when the variation of drain current (e.g. IDS1 or IDS2) of an FET (e.g. M1B or M2B) before the RF reliability test is overlapped or closed to the variation of drain current of the FET after the RF reliability test, the FET may pass the RF reliability test. When the variation of drain current (e.g. IDS1 or IDS2) of an FET (e.g. M1B or M2B) before the RF reliability test deviates from the variation of drain current of the FET after the RF reliability test, the FET may fail the RF reliability test. For example, in FIG. 7A, the curve 702, i.e. the variation of drain current IDS1 of the FET M1B before the RF reliability test, is substantially overlapped with the curve 704, i.e. the variation of drain current IDS1 of the FET M1B after the RF reliability test. Therefore, the FET M1B (as well as other FETs M1B in the power amplifier 200) may pass the RF reliability test. For another example, in FIG. 7B, the curve 708, i.e. the variation of drain current IDS2 of the FET M2B after the RF reliability test, deviates from the curve 706, i.e. the variation of drain current IDS2 of the FET M2B before the RF reliability test. Therefore, the FET M2B (as well as other FETs M2B in the power amplifier 200) may fail the RF reliability test. In this example, the degradation of the FET M2B may be caused by the hot-carrier injection (HCI) during the RF reliability test. The hot-carrier injection may shift (e.g. increase) the threshold voltage (i.e. Vth) of the FET M2B, and consequently reduces the saturation current of the FET M2B.

Figure 8:
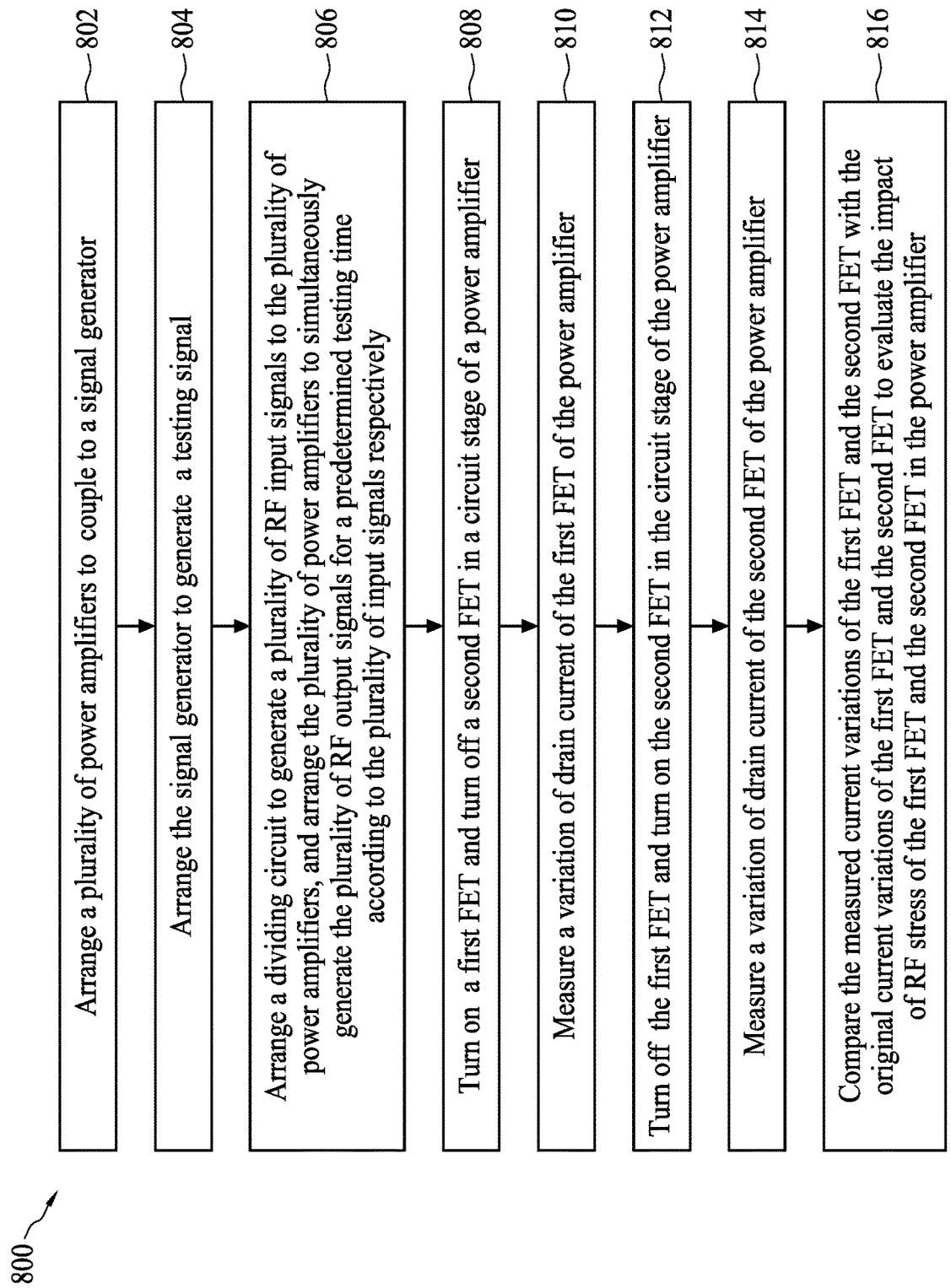
FIG. 8 is a flowchart illustrating a testing method in accordance with some embodiments.

According to some embodiments, the operation of the testing system 100 may be summarized into the operations in FIG. 8. FIG. 8 is a flowchart illustrating a testing method 800 in accordance with some embodiments. The testing method 800 is designed for testing the reliability of a plurality of power amplifiers The power amplifiers may be the power amplifiers 102_1-102_N. The method 800 comprises operations 802-808.

In operation 802, the power amplifiers 102_1-102_N are arranged to couple to the signal generator 104. The power amplifiers 102_1-102_N are implemented in multiple chips for being tested simultaneously.

In operation 804, the signal generator 104 is arranged to the testing signal St. The testing signal St may be a sinusoidal signal (or a modulated signal) with a predetermined frequency.

In operation 806, the dividing circuit 106 is arranged to provide the RF input signal Sri_1-Sri_N to the power amplifiers 102_1-102_N according to the testing signal St respectively. Then, the power amplifiers 102_1-102_N are arranged to simultaneously generate the output signals Sro_1-Sro_N for a predetermined testing time according to the RF input signal Sri_1-Sri_N respectively to stress the devices in the power amplifiers 102_1-102_N respectively.

In operation 808, the FET M1B of the circuit stage 2048_m is turned on and the FET M2B of the circuit stage 2048_m is turned off.

In operation 810, the first measuring process is performed upon the FET M1B of the circuit stage 2048_m for measuring the variation of drain current (e.g. the saturation current) of the FET M1B with respect to the first reference voltage VG1 (i.e. the gate-source voltage drop).

In operation 812, the FET M1B of the circuit stage 2048_m is turned off and the FET M2B of the circuit stage 2048_m is turned on.

In operation 814, the second measuring process is performed upon the FET M2B of the circuit stage 2048_m for measuring the variation of drain current (e.g. the saturation current) of the FET M2B with respect to the second reference voltage VG2 (i.e. the gate-source voltage drop).

In operation 816, the FIG. measured current variations of the FETs M1B and M2B are compared with the original current variations of the FETs M1B and M2B to evaluate the impact of RF stress of the FETs M1B and M2B in the power amplifier 400 respectively.

Briefly, according to the present embodiments, the testing system 100 is capable of performing RF reliability test upon a plurality of power amplifiers operated under relatively high output powers. Moreover, after the RF stress, the device-level characterizing process is arranged to characterize the device-level (e.g. transistor level) characteristics in each of the power amplifiers. Therefore, the throughput of the RF reliability test of the power amplifiers may be improved, and the transistors impacted by the RF stress in the power amplifiers may be identified.

According to some embodiments, a testing system may be provided. The testing system may include a dividing circuit and a plurality of power-amplifier chips. The dividing circuit may be configured to receive a testing signal and provide a plurality of input signals according to the testing signal. The power-amplifier chips may be coupled to the dividing circuit, each of the plurality of power-amplifier chips being configured to be tested by receiving a respective input signal of the plurality of input signals and generating a respective output signal for a predetermined testing time.

According to some embodiments, a power amplifier may be provided. The power amplifier may include a first transforming circuit, a plurality of first circuit stages, a plurality of second circuit stages, and a second transforming circuit. The first transforming circuit may be arranged to generate an non-inverting input signal and an inverting input signal according to an input signal. The first transforming circuit may include a first inductor having a first terminal coupled to the input signal and a second terminal coupled to a first reference voltage level; a second inductor magnetically coupled to the first inductor and having a first terminal and a second terminal for generating the non-inverting input signal and the inverting input signal according to the input signal respectively; a first turns of the first inductor may be greater than a second turns of the second inductor. The plurality of first circuit stages may be coupled to the first transforming circuit for generating an inverting output signal according to the non-inverting input signal. The plurality of second circuit stages may be coupled to the first transforming circuit for generating an non-inverting output signal according to the inverting input signal. The second transforming circuit may be coupled to the plurality of first circuit stages and the plurality of second circuit stages for generating an output signal according to the inverting output signal and the non-inverting output signal. The second transforming circuit may include a first inductor having a first terminal and second terminal coupled to the non-inverting output signal and the inverting output signal respectively; a second inductor magnetically coupled to the first inductor and having a first terminal outputted the output signal and a second terminal coupled to a first reference voltage, wherein a first turns of the first inductor may be less than a second turns of the second inductor. The plurality of first circuit stages may be connected in parallel, and the plurality of second circuit stages may be connected in parallel.

According to some embodiments, a testing method may be provided. The testing method may include: arranging a signal generator to generate a testing signal; arranging a dividing circuit to generate a plurality of input signals according to the testing signal; and simultaneously testing a plurality of power-amplifier chips by arranging the plurality of power-amplifier chips to simultaneously generate a plurality of output signals for a predetermined testing time according to the plurality of input signals respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit, comprising:
   a dividing circuit configured to receive a testing signal and provide a plurality of input signals according to the testing signal; and
   a plurality of integrated power-amplifiers coupled to the dividing circuit, each of the plurality of integrated power-amplifiers being configured to be tested by receiving a respective input signal of the plurality of input signals and generating a respective output signal for a predetermined testing time.

2. The circuit of claim 1, wherein the plurality of power-amplifiers are arranged to simultaneously generate the plurality of output signals for the predetermined testing time according to the plurality of input signals respectively.

3. The circuit of claim 1, wherein the plurality of input signals and the plurality of output signals are radio frequency (RF) signals.

4. The circuit of claim 1, wherein at least one of the plurality of power-amplifiers comprises:
   a first transforming circuit, arranged to generate a differential input signal according to an input signal of the plurality of input signals;
   a gain stage, coupled to the first transforming circuit, for generating a differential output signal according to the differential input signal; and
   a second transforming circuit, coupled to the gain stage, for generating an output signal of the plurality of output signals according to the differential output signal.

5. The circuit of claim 4, wherein the gain stage comprises:
   a first resistor, having a first terminal for receiving an inverting input signal of the differential input signal;
   a plurality of first circuit stages, coupled to a second terminal of the first resistor, for generating an non-inverting output signal of the differential output signal according to the inverting input signal of the differential input signal;
   a second resistor, having a first terminal for receiving an non-inverting input signal of the differential input signal; and
   a plurality of second circuit stages, coupled to a second terminal of the second resistor, for generating an inverting output signal of the differential output signal according to the non-inverting input signal of the differential input signal.

6. The circuit of claim 5, wherein at least one of the plurality of first circuit stages comprises:
a first field-effect transistor (FET), having a first connecting terminal coupled to a first reference voltage, a control terminal coupled to the second terminal of the first resistor; and
a second FET, having a first connecting terminal coupled to a second connecting terminal of the first FET, a control terminal coupled to a second reference voltage, and a second connecting terminal outputted the non-inverting output signal of the differential output signal; and
at least one of the plurality of second circuit stages comprises:
a third FET, having a first connecting terminal coupled to the first reference voltage, a control terminal coupled to the second terminal of the second resistor; and
a fourth FET, having a first connecting terminal coupled to a second connecting terminal of the third FET, a control terminal coupled to the second reference voltage, and a second connecting terminal outputted the inverting output signal of the differential output signal.

7. The circuit of claim 4, wherein the second transforming circuit comprises:
a first inductor, having a first terminal and second terminal coupled to an non-inverting output signal and an inverting output signal of the differential output signal respectively;
a second inductor, magnetically coupled to the first inductor, and having a first terminal outputted the output signal of the plurality of output signals and a second terminal coupled to a first reference voltage; and
a capacitor, having a first terminal and second terminal coupled to the first terminal and the second terminal of the first inductor respectively;
wherein a predetermined position of the first inductor is coupled to a second reference voltage level, and a first turns of the first inductor is less than a second turns of the second inductor.

8. A power amplifier, comprising:
a first circuit comprising a first inductor and a second inductor magnetically coupled to the first inductor;
a plurality of slicing cascoded stages coupled to the second inductor of the first circuit;
a second circuit comprising: a first inductor coupled to the plurality of slicing cascoded stages, and a second inductor magnetically coupled to the first inductor,
wherein the plurality of slicing cascoded stages are connected in parallel.

9. The power amplifier of claim 8, wherein a ratio of a turn of the first inductor of the first circuit to a turn of the second inductor of the first circuit is greater than 1.

10. The power amplifier of claim 8, wherein a ratio of a turn of the first inductor of the second circuit to a turn of the second inductor of the second circuit is less than 1.

11. The power amplifier of claim 8, wherein the second circuit further comprises a capacitor connected in parallel to the first inductor of the second circuit.

12. The power amplifier of claim 8, wherein the plurality of slicing cascoded stages comprises a first cascoded stage comprising a first transistor and a second transistor.

13. The power amplifier of claim 12, wherein the first cascoded stage comprises a resistor connected between a gate terminal of the first transistor and the second inductor of the first circuit.

14. The power amplifier of claim 12, wherein a gate terminal of the second transistor is connected to a virtual ground.

15. The power amplifier of claim 8, wherein each of the plurality of slicing cascoded stages comprises a first transistor and a second transistor.

16. The power amplifier of claim 15, wherein a gate terminal of the first transistor of all of the plurality of slicing cascoded stages are connected together.

17. The power amplifier of claim 15, wherein a gate terminal of the second transistor of all of the plurality of slicing cascoded stages are connected together.

18. A method for simultaneously testing a plurality of power-amplifiers, each of the plurality of power-amplifiers comprising a first transistor and a second transistor, each of the first transistor and the second transistor comprising a first source/drain terminal and a second source/drain terminal, wherein the second source/drain terminal of the first transistor is connected to the first source/drain terminal of the second transistor, the method comprising:
turning on the first transistor and turning off the second transistor;
making a measurement for the first transistor;
turning on the second transistor and turning off the first transistor; and
making a measurement for the second transistor.

19. The method of claim 18, wherein making a measurement for the first transistor comprises measuring a drain current of the first transistor.

20. The method of claim 18, wherein making a measurement for the second transistor comprises measuring a drain current of the second transistor.

* * * * *